United States Patent
Calame

(10) Patent No.: US 10,088,748 B2
(45) Date of Patent: Oct. 2, 2018

(54) PROCESS FOR MANUFACTURING A MULTI-LEVEL TIMEPIECE COMPONENT

(71) Applicant: ROLEX SA, Geneva (CH)

(72) Inventor: Florian Calame, Epalinges (CH)

(73) Assignee: ROLEX SA, Geneva (CH)

( * ) Notice: Subject to any disclaimer, the term of this patent is extended or adjusted under 35 U.S.C. 154(b) by 227 days.

(21) Appl. No.: 14/967,079

(22) Filed: Dec. 11, 2015

(65) Prior Publication Data

US 2016/0179000 A1    Jun. 23, 2016

(30) Foreign Application Priority Data

Dec. 19, 2014    (EP) .................................... 14199213

(51) Int. Cl.
| | | |
|---|---|---|
| G03F 7/00 | (2006.01) | |
| B81C 99/00 | (2010.01) | |
| G04B 13/02 | (2006.01) | |
| G04B 15/14 | (2006.01) | |

(52) U.S. Cl.
CPC .......... G03F 7/0035 (2013.01); B81C 99/008 (2013.01); G04B 13/02 (2013.01); G04B 15/14 (2013.01)

(58) Field of Classification Search
CPC ........... Y10T 29/4959; Y10T 29/49579; Y10T 29/49581; Y10T 29/4998; Y10T 29/49989; Y10T 29/49982; Y10T 29/49993; C23F 1/02; C23F 1/04; B44C 1/227; B44C 1/228
USPC ........ 427/282, 331, 404, 405; 205/170, 184, 205/188, 191, 198
See application file for complete search history.

(56) References Cited

U.S. PATENT DOCUMENTS

| | | | | |
|---|---|---|---|---|
| 7,169,707 B2 * | 1/2007 | Maeng | .................. | H01L 21/486 257/E23.006 |
| 2010/0243603 A1 | 9/2010 | Fiaccabrino et al. | | |
| 2013/0279307 A1 | 10/2013 | Fiaccabrino et al. | | |

FOREIGN PATENT DOCUMENTS

| | | |
|---|---|---|
| CH | 701 266 A2 | 12/2010 |
| CH | 704 806 A2 | 5/2012 |
| EP | 0 851 295 A1 | 7/1998 |
| EP | 2 060 534 A1 | 5/2009 |
| EP | 2 405 300 A1 | 1/2012 |

OTHER PUBLICATIONS

Glassey EP 2405300 A1 English Translation.*

(Continued)

*Primary Examiner* — Jason L Vaughan
*Assistant Examiner* — Amanda Meneghini
(74) *Attorney, Agent, or Firm* — Westerman, Hattori, Daniels & Adrian, LLP

(57) ABSTRACT

A process for manufacturing a multilayer timepiece component, wherein it comprises the following steps:
  E1, E2: manufacturing at least one first metal layer (13) of the timepiece component on the upper surface of a substrate (10);
  E13: separating the substrate (10) from the structure obtained by the preceding step, in order to obtain a sheet; then
  E4, E5; E14, E15: producing at least one other metal layer (23; 33) of the timepiece component and/or carrying out an operation for machining a metal layer after separation of the substrate (10) on the upper and/or lower surface of the sheet.

19 Claims, 6 Drawing Sheets

(56) References Cited

OTHER PUBLICATIONS

European Search Report dated Jul. 6, 2015 issued in corresponding EP Application No. EP14199213; with English partial translation and partial machine translation (7 pages).
European Search Report dated Jul. 8, 2015 issued EP Application No. EP14199218, co-pending U.S. Appl. filed concurrently; with English partial translation and partial machine translation (11 pages).

* cited by examiner

PROCESS FOR MANUFACTURING A MULTI-LEVEL TIMEPIECE COMPONENT

The present invention relates to a process for manufacturing a metal component by a photolithography and galvanic deposition technique. This type of process is used in particular for the manufacture of metal components that are in the form of multi-level three-dimensional microstructures, in order to form in particular timepiece movement components.

DGC Mitteilungen No. 104, 2005, mentions the use of LIGA technology (LIthographie Galvanik Abformung: method devised by W. Ehrfeld of the Karlsruhe Nuclear Research Center, Germany) for the manufacture of high-precision metal timepiece parts, such as for example pallets or escape wheels. This process comprises the formation of a mold made of resin that is sensitive to X-rays, by irradiation with a high-energy X-ray beam generated by a synchrotron, which represents a major drawback.

A. B. Frazier et al., Journal of Microelectromechanical Systems, 2, 2, June 1993, describe the manufacture of metal structures by electroplating of metal in molds made of polyimide-based photoresist, which are prepared by means of a process using a technology referred to as LIGA-UV, similar to the LIGA technology mentioned above, but with UV illumination of the resist instead of X-ray irradiation.

The three-dimensional shapes of the timepiece components are often complex, and comprise discontinuities formed by superposed portions of very different cross sections. By way of example, FIG. 1 represents a jumper 1, comprising a lower portion 2 having a flat upper surface over which a second portion 3 extends. Such a three-dimensional shape is referred to as a "multi-level shape" since it is possible to distinguish two superposed portions 2, 3 having very different cross sections in a certain direction z, forming a discontinuity at their boundary, in the plane of the upper surface of the lower portion 2. Each portion 2, 3 comprises a cross section through a plane perpendicular to the direction z that is substantially constant or that varies continuously. If the portions of a component having a multi-level shape are produced by separate layers of galvanic deposition during the implementation of a LIGA process, a weakness of the resulting component is observed at the boundary between the separate layers, which may lead to an accidental separation of the layers. It is therefore advisable to define a process for manufacturing a multi-level timepiece component which enables it to withstand large mechanical stresses, in particular shear stresses and/or tensile stresses in a vertical direction.

Patent EP 2 405 300 describes various exemplary embodiments of a process for manufacturing a metal part having at least two levels. According to one particular exemplary embodiment, the process comprises the following successive steps:
  depositing a first photoresist layer on a substrate covered with a conductive layer, this first layer defining a first level;
  obtaining a first mold by making a cavity in the first resist layer by photolithography with the aid of a mask, followed by development of the resist;
  depositing a metal or an alloy in the first mold, by a galvanic deposition initiated by the conductive layer, in order to form a first-level metal layer;
  completely removing the remaining resist from the first layer in order to leave only the first-level metal layer on the substrate;
  depositing a second resist layer on the substrate, for example of greater thickness than the first-level metal layer, then, by photolithography with the aid of a mask, followed by development of the resist, forming a hollow space delimited by the conductive layer, the side walls of the first-level metal layer and side walls of the second resist layer.

This hollow space ultimately constitutes a second mold in which it is possible to deposit a metal or alloy by a galvanic deposition initiated by the conductive layer and to form (after removal of the resist and of the substrate) a metal component having at least two levels interlocked with one another.

In summary, document EP 2 405 300 therefore proposes the manufacture of a multi-level component with the aid of separate layers obtained by a LIGA process, so that these separate layers are interlocked, which enables them to guarantee a good connection to one another, thus reducing the risk of the accidental separation thereof. However, this process is time-consuming in terms of production time and complexifies the resist molds to be manufactured for the formation of each layer.

Document EP 0 851 295 describes another approach based on the production of a photoresist microstructure with successive resist depositions and insolations, but a development of the insolated resist on a single occasion, in order to obtain a complex three-dimensional mold corresponding to the component to be manufactured. Next, the component is obtained by an electrolytic deposition within this mold. The advantage of this approach is in obtaining a monolithic metal assembly, the various levels being produced during a single step, therefore being able to be likened to a single layer. This results in a better mechanical strength of the portions of the various levels since there is no longer the weakness observed by the boundary between the separate layers. Its drawback is its complexity, in particular for forming the resist mold. This approach does not make it possible to obtain all the desired shapes either.

Thus, the object of the present invention is to improve the situation and to propose an improved solution for manufacturing a three-dimensional metal component. In particular, this solution can allow it to achieve satisfactory mechanical strength, in particular when it is in a form having at least two levels. This solution also facilitates the production of certain geometries of multilevel components.

For this purpose, the invention relates to a process for manufacturing a multilayer timepiece component, wherein it comprises the following steps:
  manufacturing at least one first metal layer of the timepiece component on the upper surface of a substrate;
  separating the substrate from the structure obtained by the preceding step, in order to obtain a sheet; then
  producing at least one other metal layer of the timepiece component and/or carrying out an operation for machining a metal layer after separation of the substrate on the upper and/or lower surface of the sheet.

The invention is more particularly defined by the claims.

These subjects, features and advantages of the present invention will be explained in detail in the following description of particular embodiments given nonlimitingly in connection with the appended figures, among which:

Figure 1:
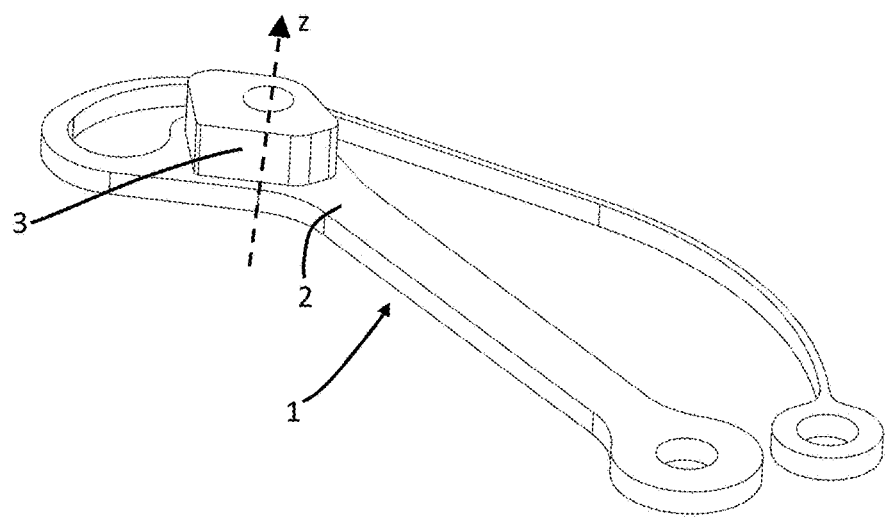
FIG. 1 represents a perspective view of a jumper for a timepiece movement.

A process will be described for manufacturing a metal component, with reference to FIGS. 13 to 18, which is particularly suitable for the manufacture of multi-level microstructures, in particular for manufacturing timepiece components. For the sake of simplicity, the terms "metal" and "metallic" will be used subsequently to denote a metal material or metal alloy.

The first step E1 of the manufacturing process consists in manufacturing a first mold having a first level N1 on a substrate 10. This substrate 10 may consist of a metal wafer in particular made of an alloy such as a stainless steel, or a silicon, glass or ceramic wafer. This substrate is preferably solid, but may also comprise structures produced by microfabrication. It is prepared according to the rules known to the person skilled in the art, in particular for the degreasing, cleaning, optionally passivation and/or activation thereof. This substrate is advantageously flat. As a variant it may comprise patterns, in particular machined patterns, and/or cavities and/or other structures, according to the teachings of the prior art. In particular, it may comprise housings for placing one or more inserts intended to be trapped or buried by the future metal layers deposited in order to finally be part of the metal component, in an immobile and non-removable manner. In the exemplary embodiment illustrated, the substrate 10 is made of a conductive material, for example of stainless steel. As a variant, it would also be possible to use a substrate made of a non-conductive material, such as for example silicon.

Optionally, a conductive layer 11 is deposited on the substrate 10, for example by evaporation. This conductive layer 11 is in particular intended to act as a cathode for the initiation of a subsequent galvanic deposition, or electroplating. In a known manner, this conductive initiation layer 11 may comprise a sublayer of chromium, nickel or titanium covered with a layer of gold or copper (it thus has a multilayer structure).

The conductive layer 11 is covered with an initial photoresist layer over a desired height. This height is preferably greater than 0 and less than or equal to 1.5 mm. The resist is a photoresist, suitable for photolithography. The resist may be negative or positive. In the first case, it is designed to become insoluble to, or difficult to dissolve by, a developer under the action of a radiation whilst, in the second case, it is designed to become soluble to a developer under the action of a radiation, whilst the portion not exposed to the radiation remains insoluble or difficult to dissolve. In the particular example of the description, the resist used is of "SU-8" type, which is a negative photoresist that polymerizes under the action of UV radiation, for example the SU-8-100 resist from Microchem. This initial resist layer defines a first level N1.

A step of photolithography of the initial resist layer is carried out, which consists in exposing the initial resist layer to light radiation, or insolating it, through a mask comprising openings and opaque regions.

This mask defines the pattern to be reproduced for the production of the first level of the component to be manufactured. The light radiation used for irradiating or insolating the resist is here UV radiation emitted by a UV source. It could however be envisaged to use X-rays, an electron-beam (it is then referred to as electron-beam lithography) or any other type of radiation depending on the resist used. The radiation is perpendicular to the plane in which the mask extends so as to irradiate only the regions of the resist located at the openings made in the mask. In the particular exemplary embodiment described here, the insolated resist regions become insensitive or insoluble to most developing liquids.

The previous step of exposure to light radiation (or to an electron beam) is optionally followed by a crosslinking heat treatment step, then by a development step. The development consists in removing the unexposed resist regions according to a process adapted to the resist used, for example by dissolving with a chemical or by a plasma process. After dissolving, the conductive layer 11 appears at the locations where the resist has been removed. In the case of a positive photoresist, the insolated regions would be removed for example via a chemical process and the non-insolated regions would be retained on the substrate.

Figure 13:
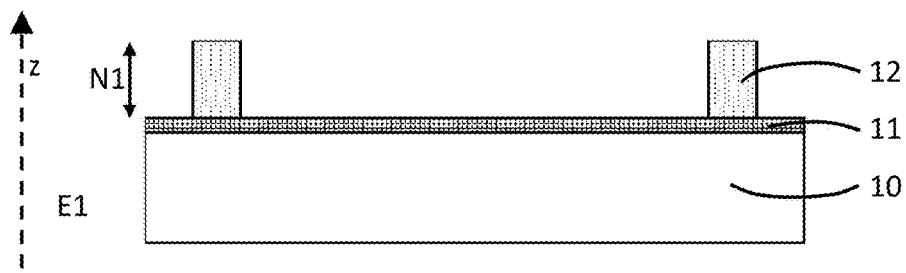
FIGS. 13 to 18 illustrate the successive steps of the process for manufacturing a metal component according to one embodiment of the invention.

The remaining portions of resist of the initial layer form a first resist mold 12 having a first level N1. The bottom of the mold is delimited by the conductive layer 11. At the end of the development step, the mold and the structure illustrated by FIG. 13 are therefore obtained, in which a substrate 10 is covered with a conductive layer 11, on which a resist mold 12 was formed over a first level N1. This construction is carried out in a single direction substantially perpendicular to the substrate 10, that will be referred to, by convention, as the vertical direction z, oriented upward in the figures so that the mold having a first level N1 is considered to be formed on top of the substrate 10, by convention. This flat substrate 10 likewise defines, by convention, a horizontal plane.

These steps of manufacturing a resist mold in an LIGA-type process are known and are not illustrated in greater detail.

The next step E2 of the process consists in depositing a first metal layer 13 in the cavities of the first resist mold 12, by electroplating, or galvanic deposition. The conductive layer 11 according to the embodiment illustrated, or as a variant the substrate 10 if the latter is conductive, acts as a cathode for initiating the deposition. This step uses, for example, the LIGA process and a metal such as, for example, nickel (Ni) or nickel-phosphorus (NiP). The metal layer 13 obtained, represented in FIG. 14, preferably has the same height as that of the initial layer of resist, corresponding to the height of the resist mold 12. It may also have a height lower than the height of the resist mold 12, or a height higher than the height of the resist mold 12. Optionally, this step E2 may comprise a thickness-setting operation, by simultaneous mechanical polishing of the metal layer and of the remaining resist, in order to obtain a perfectly flat horizontal upper surface. The upper surface 15 of the metal layer is then perfectly aligned with the upper surface 16 of the resist mold 12, these two surfaces 16, 15 therefore defining the upper plane of the first level N1 of the intermediate structure obtained after this formation of a first metal layer 13. This plane is substantially horizontal in this embodiment.

As an embodiment variant that is not represented, the metal layer 13 might not occupy the entire height of the first mold 12, its upper surface 15 remaining below the upper surface 16 of the mold 12.

The early removal of the substrate 10 from the rest of the structure, and optionally of the optional conductive layer 11, is then carried out.

In practice, this removal may be carried out as soon as the first metal layer is manufactured, i.e. after carrying out step E2 described above, the result of which is illustrated by FIG.

14. This results in a firmly attached sheet formed from the first metal layer 13 and the resist 12, i.e. the first level N1 of the structure. This sheet finally fulfills the role of substrate for the continuation of the process.

Figure 15:
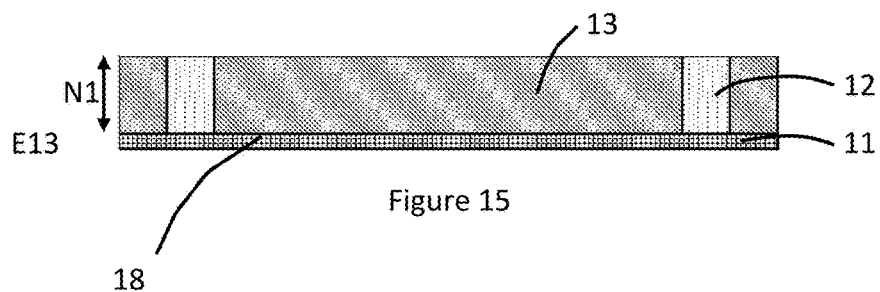

At this stage, the substrate 10 is removed or detached (in any case separated from the rest of the structure), in a step E13, in order to attain the structure represented in FIG. 15, referred to as a sheet.

Figure 16:
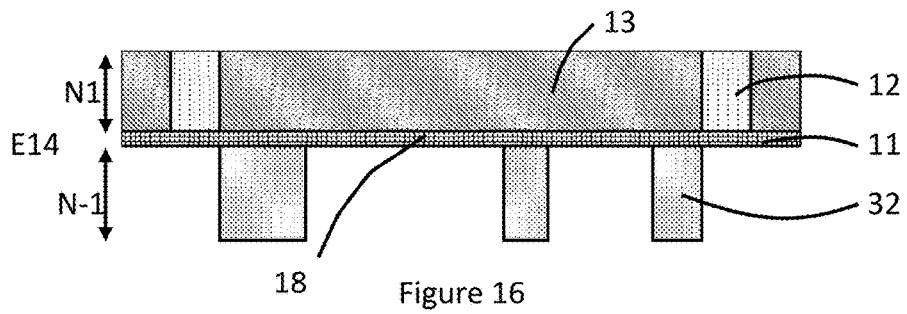

The process then comprises a step of depositing a second resist layer, in this example again an SU-8 negative photoresist layer. As a variant, a different resist may be used. In the example illustrated here, this second layer is deposited starting from the lower surface 18 of the first layer of level N1. It thus defines a second level N−1, extending vertically beneath the first level N1. The height of the second level N−1 is advantageously strictly greater than 0 and less than or equal to 1.5 mm. It may be equal to or different from the height of the first level, depending on the height of the second level of the final component to be manufactured. The step E14 of obtaining a second mold 32, as illustrated by FIG. 16, is finalized by photolithography of the second resist layer, via photolithography and developing steps, similar to those of the previous steps described in order to form the resist mold of the first level.

Figure 17:
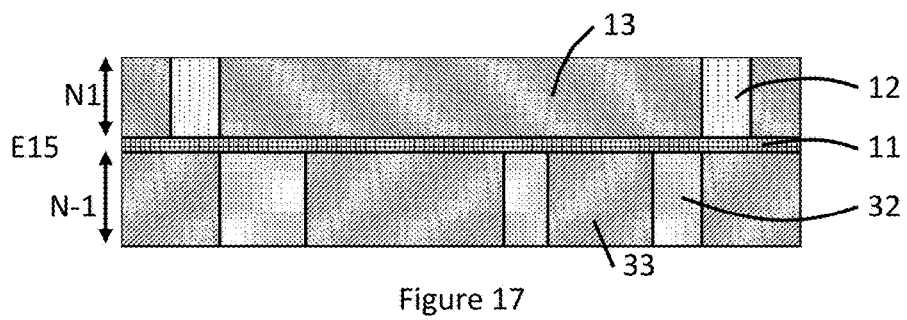

The process then comprises a step E15 of electroplating or galvanic deposition, consisting in depositing a second metal layer 33 in the mold 32. This layer extends beneath the lower surface 18 of the first metal layer 13. It preferably has a height of at least 10 μm beneath the first metal layer 13. It may fill all or some of the height of this second resist mold 32 of the second level N−1. This step may be optionally followed by a thickness-setting operation, by mechanical polishing of the metal layer and of the resist. The result of this step is illustrated by FIG. 17.

As an observation, the electroplating of the second metal layer 32 is here initiated by the conductive layer 11 which covers the substrate 10 and which has been retained after removal of the substrate. As a variant, this conductive layer 11 may be removed at the same time as the substrate 10, the initiation being obtained by the first metal layer 13.

Figure 18:
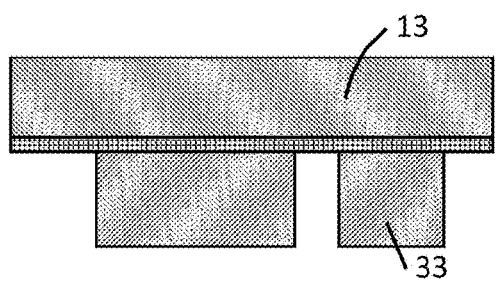

After removal of the resist, in a step E16, a two-level metal component is obtained, as illustrated by FIG. 18.

This embodiment variant enables the implementation of steps of the process that are impossible to implement without the removal of the substrate. In particular, as it has been shown, it makes it possible to construct elements of the metal component beneath the sheet, more precisely starting from the lower surface 18 of the first metal layer 13. For example, one or more other metal layers may be added by growth to this metal layer, by galvanic deposition or electroplating, for example by a LIGA process as described above. If a conductive layer 11 was deposited prior to the deposition of the first metal layer 13, it is possible either to retain this conductive layer for the subsequent operations, or to remove it. The sheet then acts as initial support starting from which it is possible to add metal layers over and underneath the first metal layer 13. One advantage of the addition of a layer underneath this sheet is to benefit from the flatness of the lower surface 18 previously constructed on the support 10. Thus, for a three-level metal component to be manufactured, it may be advantageous to position two layers respectively over and underneath the sheet in order to benefit from the well-controlled flatness of the upper 15 and lower 18 two surfaces of the sheet.

As has been mentioned above, the manufacturing process may comprise various variants wherein other layers of the component are produced on top of and/or underneath the upper metal layer 13 of this metal component. Once the sheet (juxtaposed metal layer and resist) is separated from the substrate, all the steps described previously may be carried out on this component. As a variant, the resist may be removed at a subsequent moment of the process.

As an observation, it is generally preferable to deposit a conductive layer on one of the surfaces of the metal layer, or on both surfaces. As an observation, the expression "growth underneath this layer or surface" means, in the aforegoing context, "on or starting from the lower surface of the layer detached from the substrate", the growth taking place starting from the lower surface 18.

According to another embodiment variant, the early removal of the substrate may be carried out at any other subsequent step of the manufacturing process, in particular when a component having more than two levels is manufactured, by formation of more than two layers. For example, this removal could be carried out just before the formation of the last metal layer of the component, and therefore before the last step of galvanic deposition or electroplating, and optionally before the last step of forming a resist mold. As a variant, this removal could be carried out before a last operation for levelling the upper surface obtained during the last step of galvanic deposition or electroplating. As a variant, this removal could be carried out before a last operation for machining the upper surface obtained during the last step of galvanic deposition or electroplating.

In order to illustrate these embodiment variants, FIGS. 2 to 8 illustrate steps of a process for manufacturing a multi-level multilayer component, during which the early removal of the substrate 10, not illustrated, could be carried out at several steps of the process.

Figure 2:
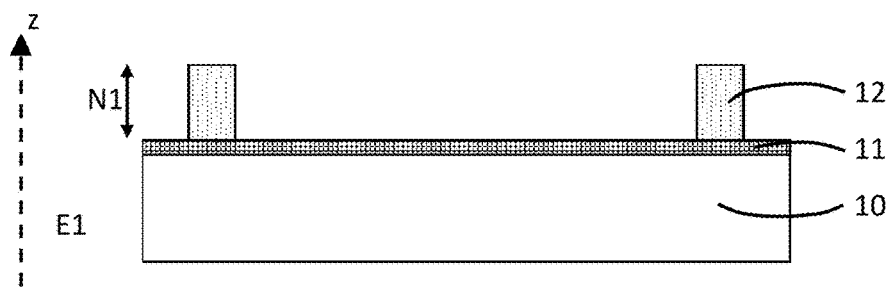
FIGS. 2 to 8 illustrate the successive steps of a process for manufacturing a metal component, which steps can be wholly or partly implemented in embodiments of the invention.
Figure 3:
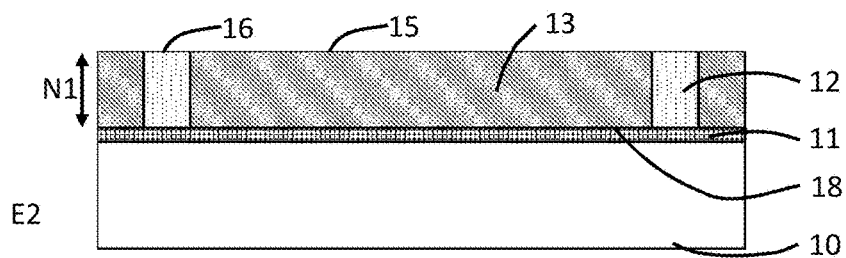
Figure 14:
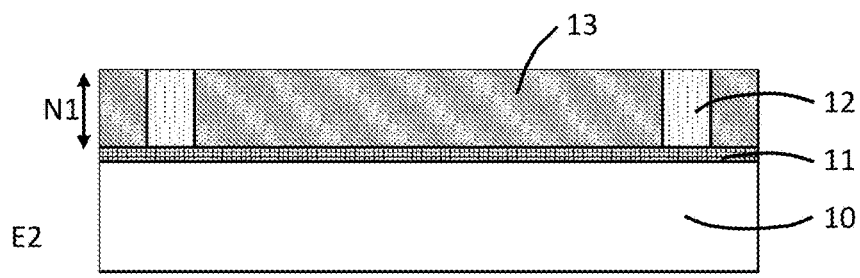

This manufacturing process comprises two steps E1, E2, illustrated by FIGS. 2 and 3, which correspond to FIGS. 13 and 14 and have already been described. As illustrated previously, the step E13 of removal of the substrate 10 could be carried out at that moment.

Figure 4:
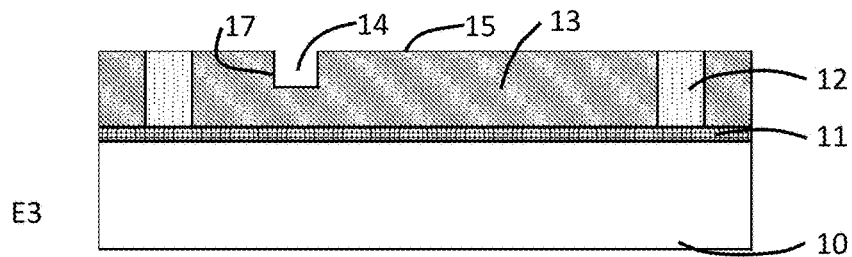

The process then comprises a step E3 of machining the first metal layer 13, in order to form a cavity 14, illustrated in FIG. 4. As will be explained in detail subsequently, the role of this cavity is to receive a portion of the second metal layer that will be superposed, in order to make it possible to interlock the two metal layers.

This step E3 of forming the cavity 14 comprises a step of mechanical machining, such as a milling and/or a drilling, or any other mechanical machining. As a variant, it may be carried out by laser ablation, for example using a femtosecond pulse laser. As a variant, a chemical machining, or an ultrasound machining, or an electrical discharge machining, or a localized machining by discharge in a dielectric medium may be used. Accordingly, said machining step is performed by using material removing processes, ingeniously combined with a distinct step of building a full metal or alloy layer with the additive process of electrodeposition.

This cavity 14 is formed by an action starting from the upper surface 15 of the metal layer 13. In this exemplary embodiment, and preferably, the final cavity 14 is in the form of a blind hole. This blind cavity may have various depths, which may extend to 90% at most of the height of the metal layer 13. The cavity may leave a minimum amount of material in the bottom of the cavity 14, having a height greater than or equal to 10 μm. In other words, the cavity 14 is separated from the substrate 10 by a thickness greater than or equal to 10 μm of material of the first metal layer 13. The depth of the cavity 14 may be chosen as a function of the final geometry of the component and according to the mechanical stresses that it will be subjected to, a greater depth ensuring a better interlocking of the two superposed layers and therefore a better final mechanical strength.

As a variant that is not represented, a cavity may be a through cavity, this step eliminating the metal of the first metal layer 13 over its entire height in a certain region, revealing a portion of the conductive layer 11 of the substrate.

In the embodiment illustrated by FIG. 4, the cavity 14 has side walls 17 that are substantially vertical, and therefore substantially perpendicular to the upper surface 15 of the metal layer 13. As a variant, several cavities, of different or identical dimensions, depth and/or geometry may be formed.

According to one advantageous embodiment variant, the cavity 14 has side walls 17 that are inclined so that the cavity 14 has a horizontal cross section that is greater when the depth increases. As a variant, the side walls 17 may have any non-vertical shape (not completely perpendicular to the substrate), so that the cavity 14 comprises a horizontal flat cross section greater, at at least one depth below the level of the upper surface 15 of the metal layer 13, than its opening 19 level with the upper surface 15 of the metal layer 13. These side walls are thus not necessarily flat. They may be curved. They are not necessarily continuous either. They may be stepped. In any case, this approach further improves the relative anchoring of the two layers, in particular the anchoring or the hold in the vertical direction.

Figure 5:
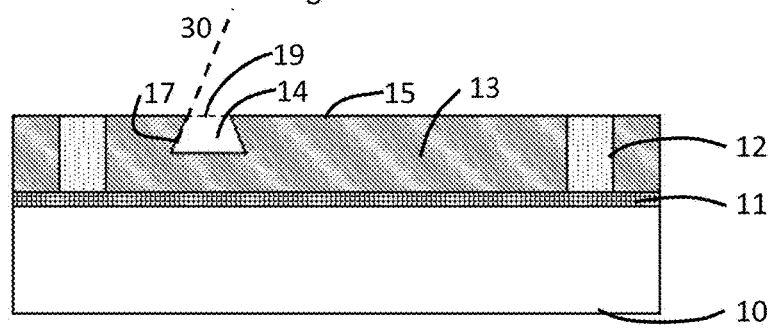

According to the embodiment illustrated by FIG. 5, the side walls 17 of the cavity 14 are inclined continuously so that the flat cross section of the cavity increases continuously with its depth below the upper surface 15 of the metal layer 13. In particular, the cavity illustrated has a cross section in a vertical plane of dovetail shape. This cavity may be machined with an angle cutter or a dovetail cutter, or by laser ablation with an oblique incidence of the laser beam 30.

Figure 6:
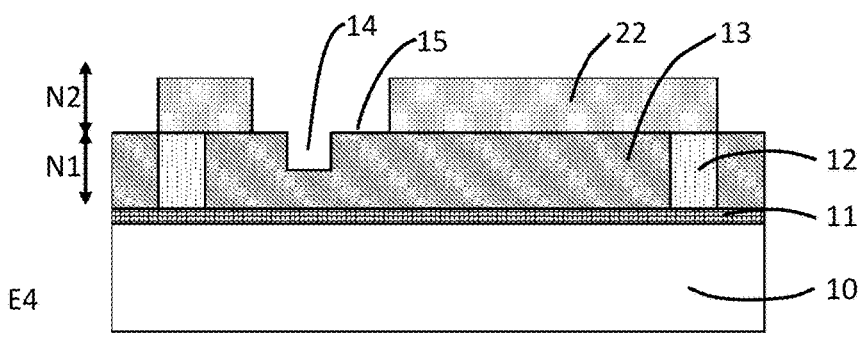

The process then comprises a step of depositing a second resist layer, in this example again an SU-8 negative photoresist layer. As a variant, a different resist may be used. This second layer is deposited so as to cover the first level N1. It thus defines a second level N2, extending vertically on top of the first level N1. The height of the second level N2 is advantageously strictly greater than 0 and less than or equal to 1.5 mm. It may be equal to or different from the height of the first level, depending on the height of the second level of the final component to be manufactured. As an observation, the resist also fills the cavity 14 of the first level N1. The step E4 of obtaining a second mold 22, as illustrated by FIG. 6, is finalized by photolithography of the second resist layer, via photolithography and developing steps, similar to those of the previous steps described in order to form the resist mold of the first level.

The process then comprises a second step E5 of electroplating or galvanic deposition, consisting in depositing a second metal layer 23 in the mold 22. This layer fills the entire volume of the cavity 14 then extends on top of the upper surface 15 of the first metal layer 13. It preferably has a height of at least 10 µm above the first metal layer 13, in particular above the cavity 14. It may fill all or some of the height of the second resist mold 22 of the second level N2. The metal layer 23 thus comprises an extension 27 which occupies the cavity 14.

Figure 7:
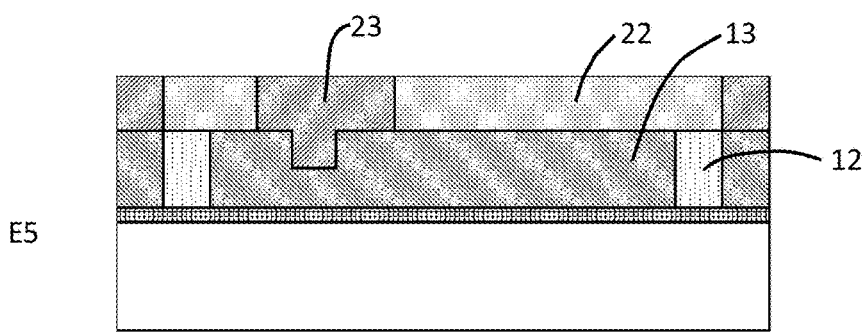
Figure 8:
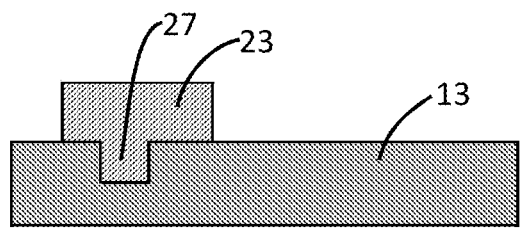

This step may be optionally followed by a thickness-setting operation, by mechanical polishing of the metal layer and of the resist. The result of this step is illustrated by FIG. 7.

As an observation, the electroplating of the second metal layer is here initiated by the deposited metal of the first level, both by its upper surface 15 and by the internal surfaces of the blind cavity 14. As a variant, it could be initiated by the conductive layer 11 covering the substrate 10 level with the cavity 14 if it is a through cavity.

Next, other layers could be added. For example, a subsequent step carried out starting from FIG. 7 may consist of the step E13 of removal of the substrate 10, then of the addition of a layer of level N−1 beneath the sheet (having two levels N1, N2), in a manner similar to the description with reference to FIGS. 15 to 18.

As a variant, another upper layer, of level N3, which is not represented, could be formed, in a manner similar to the two preceding layers. The removal of the substrate could be carried out between the depositions of the second and third layers.

Finally, the process carries out an early removal of the substrate for manufacturing the component, in order to leave a sheet comprising at least one layer comprising juxtaposed resin and metal regions.

This early separation of the sheet from the substrate 10 has the following primary advantages:
  it still enables the continuation of the manufacturing process, such as for example the formation of a blind cavity (step E3) in the metal layer 13 of the sheet, but also the production of one or more additional resist molds 22 (step E4), and the galvanic deposition or electroplating in order to form a new metal layer 23 (step E5), and the repetition of these steps in order to form additional superposed layers, and optionally the insertion of an article (insert);
  it also still enables optional levelling, intermediate machining, etc. operations;
  the sheet is thin and easy to handle for the implementation of these operations.

Naturally, it is also possible to carry out a step of forming a cavity in the lower surface 18 of the first metal layer 13, in order to obtain an interlocking of the metal layer 32 formed starting from this surface, in a manner similar to the description explained above with reference to FIGS. 4 and 5. As an observation, the first metal layer 13 of the sheet may thus comprise cavities 14 both in its upper part and in its lower part.

Optionally, operations for reworking or machining or modifying the surface, such as the deposition of a coating, may be carried out on the electroplated components, whether this is before or after detachment of the substrate and/or before or after removal of the resist.

The various metal layers of the component may be made of the same metal, or as a variant made of different materials.

The process described above for manufacturing a metal component may be used for the manufacture of timepiece components such as, by way of illustrative and nonlimiting examples, a pallet, a jumper, a wheel, a rack, a spring, a balance, a cam, a gear or else a bridge. It may naturally also be used to manufacture any metal element in microstructure form.

Figure 9:
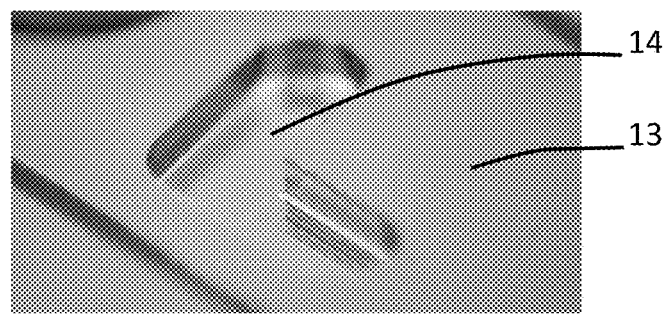
FIGS. 9 to 12 illustrate the implementation of the manufacturing process for manufacturing a jumper.
Figure 10:
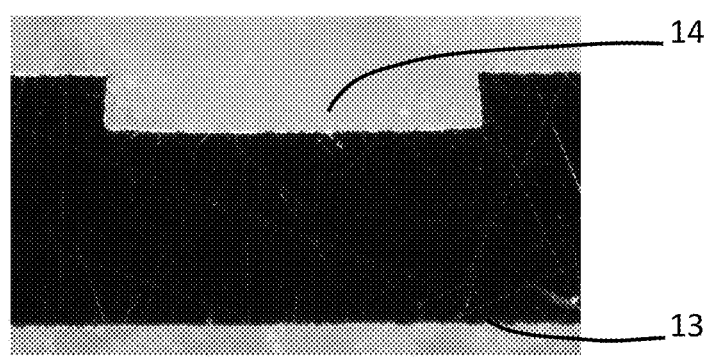
Figure 11:
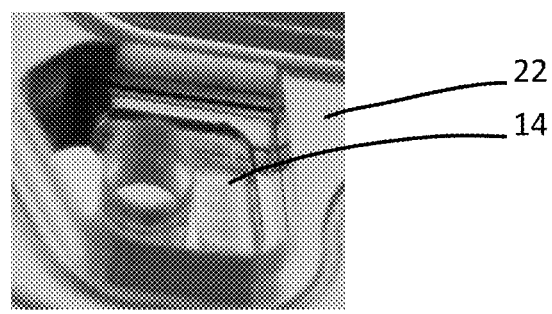
Figure 12:
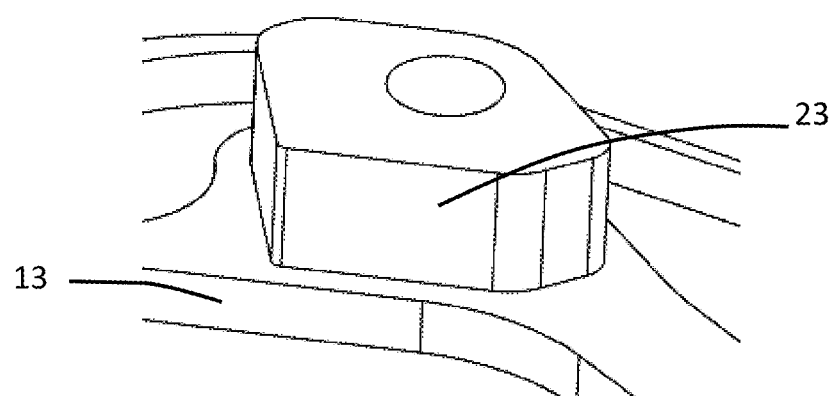

FIGS. 9 to 12 illustrate, by way of example, the manufacture of a jumper on the basis of steps E1 to E5 according to FIGS. 2 to 8. FIGS. 9 and 10 illustrate the result obtained after an intermediate step of producing a cavity 14 in a first metal layer 13. FIG. 10 makes it possible in particular to visualize the dovetail shape obtained for the cavity 14. FIG. 11 shows the intermediate result after formation of the second level resist mold 22. The cavity 14 at the bottom of the mold can be seen. The component is finalized by growth of a second metal layer 23, in order to form the second level of the jumper, as illustrated in FIG. 12.

According to one variant of the embodiment, the process may comprise an intermediate step of adding an insert, before or after detaching the substrate, followed by a step of growth of a new metal layer, which makes it possible to firmly attach the insert to the final component, and in particular to the two superposed layers, to bury it. This insert may be made of metallic or conductive material, or of an insulating material such as ruby, silicon or ceramic.

As an observation, according to another embodiment variant, the first metal layer 13 could be produced by any other process, the following steps E13 to E15 being retained.

The invention claimed is:

1. A process for manufacturing a multilayer timepiece component, comprising:
   manufacturing at least one first metal layer of the timepiece component on an upper surface of a substrate in order to obtain a structure;
   separating the substrate from the structure, in order to obtain a sheet; then
   on at least one of an upper surface and a lower surface of the sheet, performing at least one action selected from the group consisting of (i) depositing at least one other metal layer of the timepiece component and (ii) carrying out an operation for machining a metal layer of the timepiece component after separation of the substrate.

2. The process for manufacturing a timepiece component as claimed in claim 1, wherein the producing of the at least one other metal layer of the timepiece component after separation of the substrate comprises performing at least once the following actions:
   depositing a photoresist on the upper surface of the sheet;
   exposing the photoresist through a mask and developing the photoresist in order to form a mold; and
   depositing a metal galvanically in the mold.

3. The process for manufacturing a timepiece component as claimed in claim 2, wherein the producing of the at least one other metal layer of the timepiece component after separation of the substrate further comprises performing a least once the following actions:
   depositing a photoresist on the lower surface of the sheet;
   exposing the photoresist through a mask and developing the resist in order to form a mold; and
   depositing a metal galvanically in the mold.

4. The process for manufacturing a timepiece component as claimed in claim 3, comprising, after performing the depositing a photoresist, exposing the photoresist, and depositing a metal, performing at least once more the depositing a photoresist, exposing the photoresist, and depositing a metal, to add one or more other metal layers on top of the first metal layer.

5. The process for manufacturing a timepiece component as claimed in claim 3, wherein the metal is an alloy.

6. The process for manufacturing a timepiece component as claimed in claim 2, comprising, after performing the depositing a photoresist, exposing the photoresist, and depositing a metal, performing at least once more the depositing a photoresist, exposing the photoresist, and depositing a metal, to add one or more other metal layers on top of the first metal layer.

7. The process for manufacturing a timepiece component as claimed in claim 2, wherein the metal is an alloy.

8. The process as claimed in claim 1, comprising performing at least one of the following additional actions, after separation of the substrate:
   machining a surface of a the metal layer, in order to increase a flatness of the metal layer;
   depositing a conductive layer on the metal layer formed by galvanic deposition;
   dissolving photoresist forming one or more mold(s) for manufacturing one or more metal layer(s).

9. The process for manufacturing a timepiece component as claimed in claim 1, comprising:
   in a first phase, performing at least once the following actions:
      depositing a photoresist on the upper surface of the substrate;
      exposing the photoresist through a mask and developing the photoresist in order to form a mold; and
      depositing a metal galvanically in the mold in order to form the first metal layer;
   then in a second phase after the first phase, performing the following action:
      separating the substrate from the structure obtained in order to obtain a sheet comprising one or more layer(s) each comprising juxtaposed photoresist and metal regions.

10. The process for manufacturing a timepiece component as claimed in claim 9, comprising, in the first phase, after performing the depositing a photoresist, exposing the photoresist, and depositing a metal, performing at least once more the depositing a photoresist, exposing the photoresist, and depositing a metal, to add one or more other metal layers on top of the first metal layer.

11. The process for manufacturing a timepiece component as claimed in claim 9, wherein the metal is an alloy.

12. The process for manufacturing a timepiece component as claimed in claim 1, comprising performing the following actions, after separation of the substrate:
   forming at least one cavity in a surface of a metal layer;
   depositing a photoresist on the surface comprising the cavity of the metal layer;
   exposing the photoresist through a mask and developing the photoresist in order to form a mold, freeing up the at least one cavity of the surface of the metal layer; and
   depositing a metal galvanically in the at least one cavity and in the mold.

13. The process for manufacturing a timepiece component as claimed in claim 12, wherein the metal is an alloy.

14. The process for manufacturing a timepiece component as claimed in claim 1, which is one element selected from the group consisting of a jumper, a pallet, a wheel, a cam, and a rack.

15. The process for manufacturing a timepiece component as claimed in claim 14, wherein the metal is an alloy.

16. The process for manufacturing a timepiece component as claimed in claim 1, wherein the producing of the at least one other metal layer of the timepiece component after separation of the substrate comprises performing at least once the following actions:
   depositing a photoresist on the lower surface of the sheet;
   exposing the photoresist through a mask and developing the resist in order to form a mold; and
   depositing a metal galvanically in the mold.

17. The process for manufacturing a timepiece component as claimed in claim 16, comprising, after performing the depositing a photoresist, exposing the photoresist, and depositing a metal, performing at least once more the depositing a photoresist, exposing the photoresist, and depositing a metal, to add one or more other metal layers on top of the first metal layer.

18. The process for manufacturing a timepiece component as claimed in claim 16, wherein the metal is an alloy.

19. The process for manufacturing a timepiece component as claimed in claim 1, wherein the metal is an alloy.

\* \* \* \* \*